United States Patent [19]

Kawamoto et al.

[11] Patent Number: 5,369,434
[45] Date of Patent: Nov. 29, 1994

[54] CHARGE TRANSFER DEVICE WITH HIGH SPEED TRANSFER RATE

[75] Inventors: Seiichi Kawamoto; Tadakuni Narabu, both of Kanagawa, Japan

[73] Assignee: Sony Corporation, Tokyo, Japan

[21] Appl. No.: 855,089

[22] Filed: Mar. 20, 1992

[30] Foreign Application Priority Data

Mar. 20, 1991 [JP] Japan .................. 3-057269

[51] Int. Cl.$^5$ .................. H04N 3/14; H04N 5/225
[52] U.S. Cl. .................. 348/315; 348/321; 257/246
[58] Field of Search .................. 358/213.23, 213.26, 358/213.29, 213.31, 43, 44; 257/221, 231, 236, 246, 247, 248, 249

[56] References Cited

U.S. PATENT DOCUMENTS

| | | | |
|---|---|---|---|
| 4,001,878 | 1/1977 | Weimer | 358/41 |
| 4,513,313 | 3/1985 | Kinoshita et al. | 358/44 |
| 4,574,313 | 3/1986 | Battson | 358/213.26 |
| 4,831,453 | 5/1989 | Takemura | 358/213.23 |
| 4,849,814 | 7/1989 | Van De Steeg | 358/213.26 |
| 4,910,569 | 3/1990 | Erhardt | 257/246 |
| 4,985,758 | 1/1991 | Hashimoto | 358/44 |

*Primary Examiner*—Joseph Mancuso
*Assistant Examiner*—Wendy R. Greening
*Attorney, Agent, or Firm*—Hill, Steadman & Simpson

[57] ABSTRACT

The present invention is directed to a charge transfer device having a four-phase drive system register in which first, second, third and fourth transfer sections sequentially arrayed constitute one bit. The first, second, third and fourth transfer sections are arranged such that, when applied with drive pulses of the same level, a potential difference occurs between the first and third transfer sections and the second and fourth transfer sections. Also, charges are transferred by four-phase drive pulses such that the first and second transfer sections go to high level and the third and fourth transfer sections go to low level during the first transfer interval, the first, second and fourth transfer sections go to low level and the third transfer section goes to high level during the second transfer interval, the first and second transfer sections go to low level and the third and fourth transfer sections go to high level during the third transfer interval, and the first transfer section goes to high level and the second, third and fourth transfer sections go to low level during the fourth transfer interval. According to the present invention, a data rate can be increased by reducing the charge transfer time in the four-phase drive system register in the CCD solid state image sensing device.

5 Claims, 6 Drawing Sheets

CHARGE TRANSFER DEVICE WITH HIGH SPEED TRANSFER RATE

BACKGROUND OF THE INVENTION

1. Field of the Invention

The present invention generally relates to charge transfer devices and, more particularly, to a charge transfer device having a charge transfer register.

2. Description of the Prior Art

In general, a charge transfer device such as a charge-coupled device (CCD) or the like has a charge transfer region called a register formed on the chip thereof. The register is composed of a plurality of transfer electrodes arrayed to control the potential and a channel region serving as a charge transfer path formed on the under part of the transfer electrodes.

A CCD solid state image sensing device is realized by the addition of a sensor (photosensing section) which carries out the photoelectric-conversion to the above-mentioned charge transfer function. Particularly in the color solid state image sensing device, different color light transmission filters are formed and sensors corresponding to respective colors are provided. In a color linear sensor, for example, sensor section of one row or sensor sections of a plurality of rows are formed and signal is output at every color. In a color solid state image sensing device in which sensors corresponding to respective colors are sequentially arrayed, a register is provided in parallel to the sensor array. Then, signals of respective colors are transferred from the sensor section to the register one at a time and color signals are sequentially read out from the register in a distributed fashion and in the output order. Further, in a color solid state image sensing device having a plurality of sensor section arrays, a register is provided at every sensor array and respective color signals are output from the respective registers.

Also, the number of register in the charge transfer device is not limited to one and the charge transfer device includes a plurality of registers frequently. In the case of the color linear sensor, for example, a plurality of registers corresponding to respective colors are arranged in parallel to the sensor array in which sensors corresponding to respective colors are sequentially arrayed.

It is frequently observed that the above-mentioned register is driven by a four-phase driving system. In this case, in a register section 1, as shown in FIG. 1, a plurality of transfer electrodes 6 are arrayed on a channel region 4 of a first conductivity type, i.e., N type through a gate insulating layer 5 along the charge transfer direction shown by an arrow a and four transfer sections SR ($SR_1$, $S_2$, $SR_3$, $SR_4$), each having the transfer electrode 6 are formed as one bit to which four-phase drive pulses $\Phi_1, \Phi_2, \Phi_3$ and $\Phi_4$ are applied, respectively. The four-phase drive pulses $\Phi_1$, $\Phi_2$, $\Phi_3$ and $\Phi_4$ are formed of clock pulses of the same waveform as shown in FIG. 2. In FIG. 1, reference numeral 2 depicts a semiconductor substrate of a first conductivity such as N type and 3 depicts a well region of a second conductivity type such as P type.

In the conventional register driven by the four-phase drive system, as shown in FIG. 2, a signal charge is transferred from the first transfer section $SR_1$ to th second transfer section $SR_2$ during the interval from time $t_0$ to time $t_2$, transferred from the second transfer section $SR_2$ to the third transfer section $SR_3$ during the interval from time $t_2$ to time $t_4$, transferred from the third transfer section $SR_3$ to the fourth transfer section $SR_4$ during the interval from time $t_4$ to time $t_6$ and transferred from the fourth transfer section $SR_4$ to the first transfer section $SR_1$ during the interval from time $t_6$ to $t_8$, thereby one-bit transfer being effected. Accordingly, one cycle of the clock pulse for transferring the electric charge in a one-bit transfer fashion lies in a range of from $t_0$ to $t_8$. In the register of the charge transfer device, however, in order to reduce the transfer time, it is desired that a so-called data rate is increased more.

OBJECTS AND SUMMARY OF THE INVENTION

Therefore, it is an object of the present invention to provide an improved charge transfer device in which the aforesaid disadvantage of the prior art can be eliminated.

More specifically, it is an object of the present invention to provide a charge transfer device in which a data rate can be increased.

According to an aspect of a charge transfer device of the present invention, the charge transfer device having a four-phase drive system register is provided, in which first, second, third and fourth transfer sections sequentially arrayed constitute one bit. The first, second, third and fourth transfer sections are arranged such that, when applied with drive pulses of the same level, a potential difference occurs between the first and third transfer sections and the second and fourth transfer sections. Also, charges are transferred by four-phase drive pulses such that the first and second transfer sections go to high level while the third and fourth transfer sections go to low level during a first transfer interval, the first, second and fourth transfer sections go to low level while the third transfer section goes to high level during a second transfer interval, the first and second transfer sections go to low level while the third and fourth transfer sections go to high level during a third transfer interval, and the first transfer section goes to high level and the second, third and fourth transfer sections go to low level during a fourth transfer interval.

According to the above-mentioned aspect of the present invention, the potential difference occurs between the first, third transfer sections and the second, fourth transfer sections and the electric charges are transferred by the four-phase drive pulses. Therefore, one cycle of the clock pulse for transferring the electric charge by one bit is reduced to $\tau \times 4$ as compared with the prior art in which one cycle of the clock pulse is represented as $\tau \times 8$ where $\tau$ is the charge transfer period. As a result, a so-called data rate can be doubled.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

An embodiment of the present invention will now be described with reference to the drawings.

Figure 3:
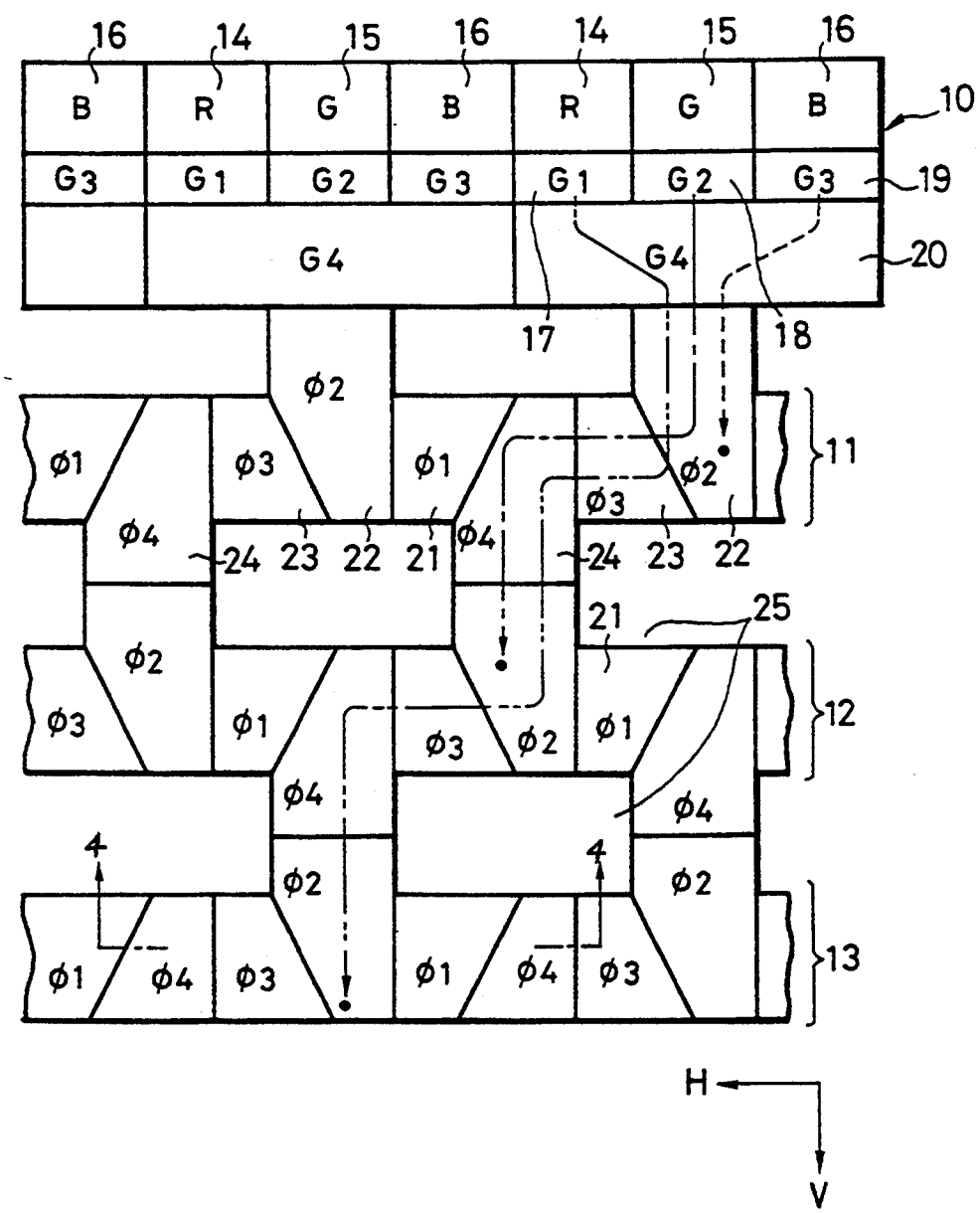
FIG. 3 is a plan view of a main portion of a charge transfer device according to an embodiment of the present invention.

In this embodiment, the present invention is applied to a color linear-type CCD solid state image sensing device which includes first to third registers. FIG. 3 of the accompanying drawings shows a plan view of a main portion thereof.

As shown in FIG. 3, a sensor array 10 is formed in the longitudinal direction which is shown by an arrow H in FIG. 3. The sensor array 10 comprises a first sensor 14 having a filter for sensing a red (R) light, a second sensor 15 having a filter for sensing a green (G) light and a third sensor 16 having a filter for sensing a blue (B) light which are arrayed in a straight line fashion, in that order. The first sensor 14 derives an electric charge associated with a red color signal, the second sensor 15 derives an electric charge associated with a green color signal and the third sensor 16 derives an electric charge associated with a blue color signal, respectively.

Gate regions 17 through 20 are formed on one side (i.e., one side in the vertical direction shown by reference letter V in FIG. 3) of the sensor array 10. The gate regions 17 through 20 function as gates for selectively reading-out signal charges from the sensor array 10 in response to the first to third sensors 14 to 16. More specifically, the gate region 17 adjoins the first sensor 14 to receive a signal $G_1$, the gate region 18 adjoins the second sensor 15 to receive a signal $G_2$ and the gate region 19 adjoins the third sensor 16 to receive a signal $G_3$, respectively. A single gate region 20 commonly adjoins the gate regions 17 to 19 in the unit of a set of gate regions 17 to 19 and the gate region 20 is controlled by a signal $G_4$. The gate region 20 is coupled to a first register 11 of registers which will be described next. The gate regions 17 to 20 alternatively derive the color signal so that, when one of the signals $G_1$ to $G_3$ is set at read-out level (e.g., high level) and the signal $G_4$ applied to the gate region 20 is simultaneously set at read-out level, then an electric charge is read out at every color signal from the sensor array 10.

First through third registers 11 to 13 are respectively provided in parallel to the sensor array 10 having the gate regions associated with the respective sensors. Each of the registers 11 to 13 comprises first, second, third and fourth transfer sections 21, 22, 23 and 24 having the transfer electrode 6 (see FIG. 4) repeatedly arrayed in the horizontal (H) direction, in that order. A first phase pulse $\Phi_1$ is supplied to the transfer electrode 6 of the first transfer section 21 of the respective registers, a second phase pulse $\Phi_2$ is supplied to the transfer electrode 6 of the second transfer section thereof, a third phase pulse $\Phi_3$ is supplied to the transfer electrode 6 of the third transfer section 23 thereof, and a fourth phase pulse $\Phi_4$ is supplied to the transfer electrode 6 of the fourth transfer section 24 thereof, respectively. The first to fourth transfer sections 21 to 24 constitute one bit.

The first and third transfer sections 21 and 23 are not adjacent to each other between the registers and electrically separated between the registers by a channel stopper region 25. The first and third transfer sections 21 and 23 adjoin other second and fourth transfer sections 22 and 24 only within the same register. The fourth transfer section 24 is sandwiched between the first and third transfer sections 21 and 23 within each of the registers 11 to 13. The fourth transfer section 24 abuts at its one side against the second transfer section 22 of other register (register of the succeeding stage such as the second register 12 for the first register and the third register 13 for the second register 12) in the vertical (V) direction between the first and second registers 11 and 12. The fourth transfer section 24 functions as a horizontal charge transfer section (H direction charge transfer section) in each register and also functions as a transfer section for transferring electric charges between the first and second registers 11 and 12 when electric charges are transferred between the registers.

Further, the second transfer section 22 is similarly sandwiched between the first and third transfer sections 21 and 23 within the respective registers 11 to 13 and abuts on its one side against the fourth transfer section 24 of other register. The second transfer section 22 functions as a horizontal charge transfer section in each register and also functions as a transfer section for receiving electric charges when electric charges are transferred between the registers and from the sensor array 10. The shapes of these transfer sections 21 through 24 are different, in which the first and third transfer sections 21 and 23 are shaped as substantially trapezoid, the fourth transfer section 24 is extended in the second transfer section 22 side and the second transfer section 22 is extended in the fourth transfer section 24 side, respectively. As a consequence, the potentials of the extended portions can be deepened as compared with those of the narrow portions, which can increase a transfer efficiency of charge between the registers and within the register.

Therefore, according to this embodiment, when the clock pulses $\Phi_1$ through $\Phi_4$ of the same level are supplied, then the transfer sections 21 through 24 are arranged in such a fashion that the potential difference occurs between the first and third transfer sections 21, 23 and the second and fourth transfer sections 22, 24, i.e., in such a manner that the potentials of the first and third transfer sections 21, 23 may be deepened and those of the second and fourth transfer sections 22, 24 are shallowed. The transfer sections 21 through 24 of each of the registers 11 to 13 are formed as, for example, shown in FIG. 4.

Figure 4:
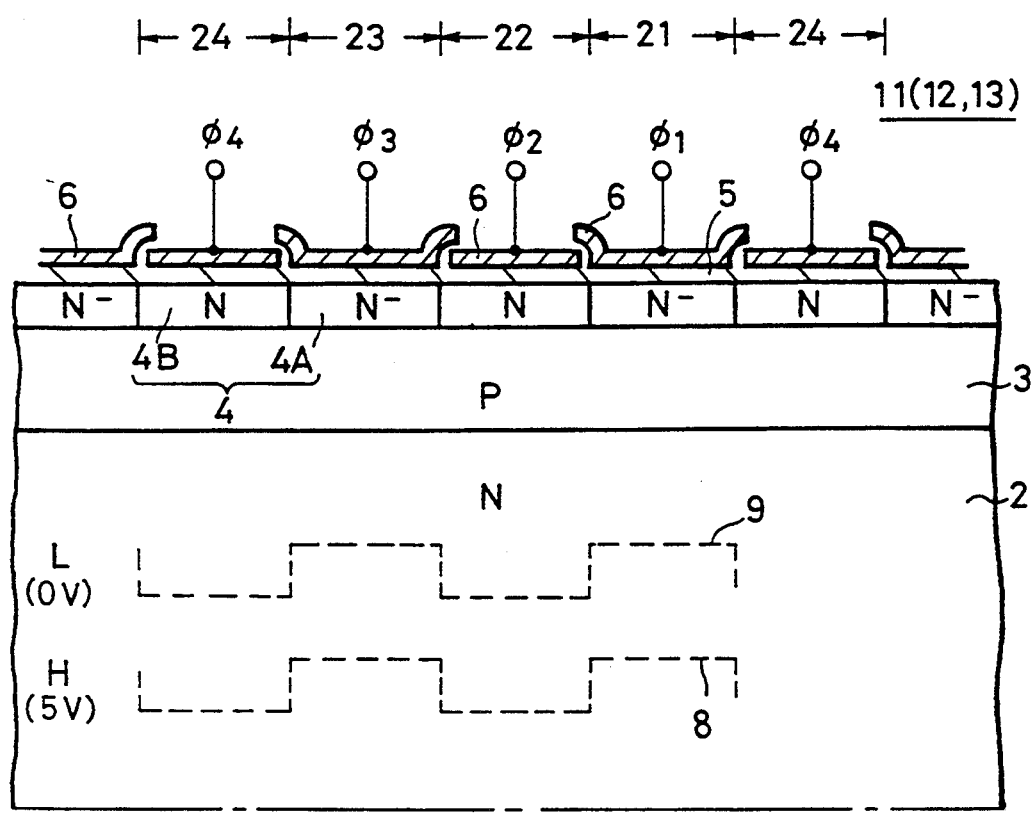
FIG. 4 is a cross-sectional view taken through the line 4—4 in FIG. 3.

In FIG. 4, reference numeral 2 depicts a semiconductor substrate of a first conductivity type, for example, N type, 3 a well region of a second conductivity type, for example, P type and 4 a channel region of N type, respectively. As shown in FIG. 4, a plurality of transfer electrodes 6 are formed on the N type channel region 4 through a gate insulating layer 5 and the first through fourth transfer sections 21 to 24 are sequentially arrayed, thus the register 11 (and the registers 12, 13)

being formed. The N type channel regions 4 under the transfer electrodes 6 of the first and third transfer sections 21, 23 are processed as N- channel regions 4A of low impurity concentration and N channel regions 4B of high impurity concentration by the ion implantation technique of P type impurities such as boron (B) or the like. As a consequence, when the clock pulses of the same level are applied thereto, the potentials of the first and third transfer sections 21, 23 are shallowed and those of the second and fourth transfer sections 22, 24 are deepened. In FIG. 4, reference numeral 8 represents a potential distribution provided when the clock pulse is at high level (e.g., 5 V) and reference numeral 9 represents a potential distribution provided when the clock pulse is at low level (e.g., 0 V).

Figure 5:
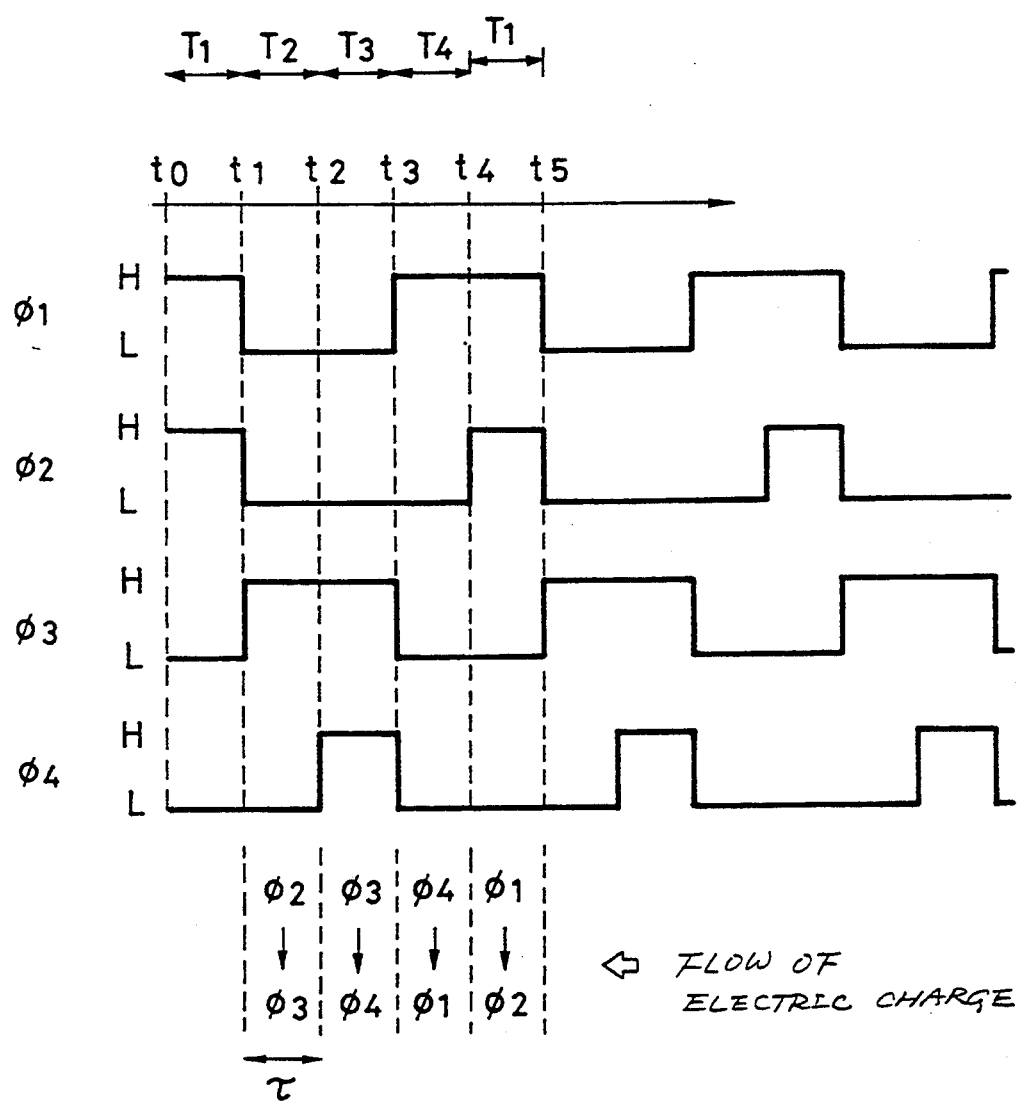
FIG. 5 is a diagram of waveforms of 4-phase drive pulses, and to which references will be made in explaining a charge transfer operation of the charge transfer device of FIG. 3 in the horizontal direction.

Further, in this embodiment, the registers 11 through 13 transfer charges in the horizontal (H) direction in response to the 4-phase drive clocks $\Phi_1$ through $\Phi_4$ whose waveforms are schematically illustrated in FIG. 5.

More specifically, considering the 4-phase drive clock pulses $\Phi_1$ through $\Phi_4$ from a one cycle timing standpoint, the first- and second-phase clock pulses $\Phi_1$ and $\Phi_2$ go to high level and the third- and fourth-phase clock pulses $\Phi_3$ and $\Phi_4$ go to low level during a first transfer interval $T_1$; the first-, second- and fourth-phase clock pulses $\Phi_1$, $\Phi_2$ and $\Phi_4$ go to low level and only the third-phase clock pulse $\Phi_3$ goes to high level during the second transfer interval $T_2$; and the first- and second-phase clock pulses $\Phi_1$ and $\Phi_2$ go to low level and the third- and fourth-phase clock pulses $\Phi_3$ and $\Phi_4$ go to high level during the third transfer interval $T_3$. Then, only the first-phase clock pulse $\Phi_1$ goes to high level and the second-, third- and fourth-phase clock pulses $\Phi_2$, $\Phi_3$ and $\Phi_4$ go to low level during the fourth transfer interval $T_4$.

Operation of the CCD solid state image sensing device of the color linear type thus arranged will be described below.

Figure 6:
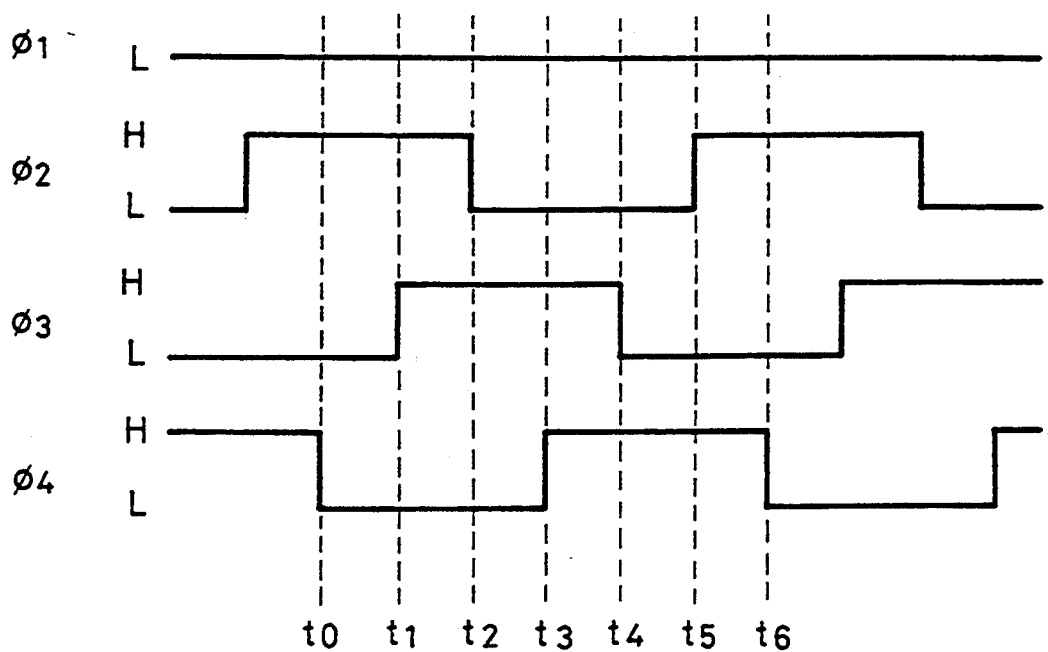
FIG. 6 is a diagram of waveforms of 4-phase drive pulses, and to which references will be made in explaining a charge transfer operation of the charge transfer device of FIG. 3 in the vertical direction.

Transfer operation of electric charges corresponding to the color signals from the respective sensors 14 to 16 to the registers 11 to 13 will be described with reference to FIG. 6.

By the selecting operation of the gate regions 17 to 20, the electric charges corresponding to the color signals from the sensors 14 to 16, e.g., the electric charge corresponding to the red color signal of the sensor 14 are selectively supplied to the second transfer section 22 of the first register 11 at time $t_0$. At timing $t_0$, only the second-phase pulse $\Phi_2$ goes to high "H" level and other pulses $\Phi_1$, $\Phi_3$ and $\Phi_4$ go to low "L" level so that the electric charge is stored in the second transfer section 22.

At the next time $t_1$, the third-phase clock pulse $\Phi_3$ changes from low to high in level, allowing the electric charge in the second transfer section 22 to flow into the third transfer section 23. At the next time $t_2$, the second-phase clock pulse $\Phi_2$ goes to low level so that the potential of the third transfer section 23 becomes deeper than that of the second transfer section 22 which sends electric charges, resulting in the electric charge being transferred to and stored in the third transfer section 23.

At the next time $t_3$, the four-phase clock pulse $\Phi_4$ changes from low to high in level, allowing the electric charge of the third transfer section 23 to flow into the fourth transfer section 24. At the next time $t_4$, the third-phase clock pulse $\Phi_3$ goes to low level so that the electric charge is stored in the fourth transfer section 24.

At the next time $t_5$, the second-phase clock pulse $\Phi_2$ changes from low to high in level, causing the electric charge existing in the fourth transfer section 24 of the first register 11 to flow into the second transfer section 22 of the second register 12. In the next time $t_6$, the fourth-phase clock pulse $\Phi_4$ goes to low level, thereby the electric charge being stored in the second transfer section 22 of the second register 12. At that time, since the second and third transfer sections 21 and 23 adjacent to the fourth transfer section 24 within the first register 11 are both at low "L" level, the electric charge of the fourth transfer section 24 is transferred to the second transfer section 22 of the second register 12 at the lower stage in the vertical (V) direction. Similar operation is repeated hereinafter and electric charges corresponding to the respective color signals are transferred in parallel. Finally, electric charges corresponding to the red signal, the green signal and the blue signal are respectively and selectively to the respective second transfer sections 22 of the corresponding third, second and first registers 13, 12 and 11.

Then, the electric charges corresponding to the respective colors transferred to the first, second and third registers 11, 12 and 13 are transferred in the horizontal (H) direction by the four-phase drive clock pulses $\Phi_1$ through $\Phi_4$ shown in FIG. 5. More specifically, during the interval $T_2$ from time $t_1$ to $t_2$, the first-, second- and fourth-phase clock pulses $\Phi_1$, $\Phi_2$ and $\Phi_4$ go to low "L" level and only the third-phase clock pulse $\Phi_3$ goes to high "H" level so that the electric charge in the second transfer section 22 is transferred to the third transfer section 23.

During the next interval $T_3$ from time $t_2$ to $t_3$, the first- and second-phase clock pulses $\Phi_1$ and $\Phi_2$ go to low "L" level and the third- and fourth-phase clock pulses $\Phi_3$ and $\Phi_4$ go to high "H" level in which the potential of the fourth transfer section 24 becomes deeper than that of the third transfer section 23 due to the above-mentioned potential difference in the third and fourth transfer sections 23 and 24, thereby resulting in the electric charge in the third transfer section 23 being transferred to the fourth transfer section 24.

During the next interval $T_4$ from time $t_3$ to $t_4$, only the first-phase clock pulse $\Phi_1$ goes to high "H" level and other second-, third- and fourth-phase clock pulses $\Phi_2$, $\Phi_3$ and $\Phi_4$ go to low "L" level so that the electric charge in the fourth transfer section 24 is transferred to the first transfer section 21.

During the interval $T_1$ from time $t_4$ to $t_5$, the first- and second-phase clock pulses $\Phi_1$ and $\Phi_2$ go to high "H" level and the third- and fourth-phase clock pulses $\Phi_3$ and $\Phi_4$ go to low "L" so that the potential of the second transfer section 22 becomes deeper than that of the first transfer section 21 due to the aforementioned potential difference in the first and second transfer sections 21 and 22, thereby the electric charge in the first transfer section 21 being transferred to the second transfer section 22. The aforementioned timings are hereinafter repeated and therefore the electric charges corresponding to the respective color signals are sequentially transferred in the horizontal (H) direction within the first to third registers 11 to 13, thereby being read-out at every registers 11 to 13.

Figure 1:
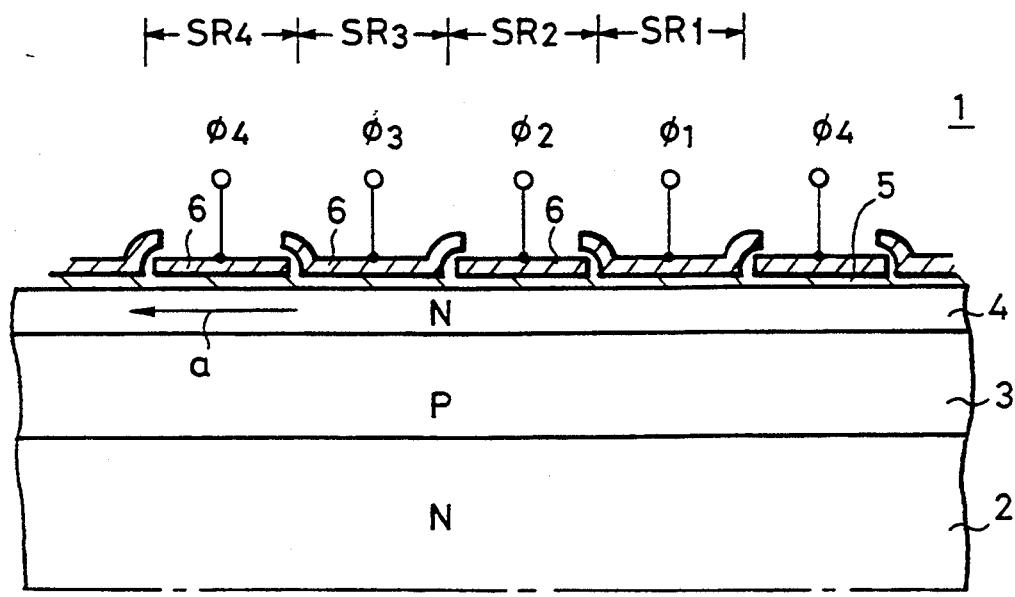
FIG. 1 is a cross-sectional view of a 4-phase drive system register used in a CCD according to the prior art.
Figure 2:
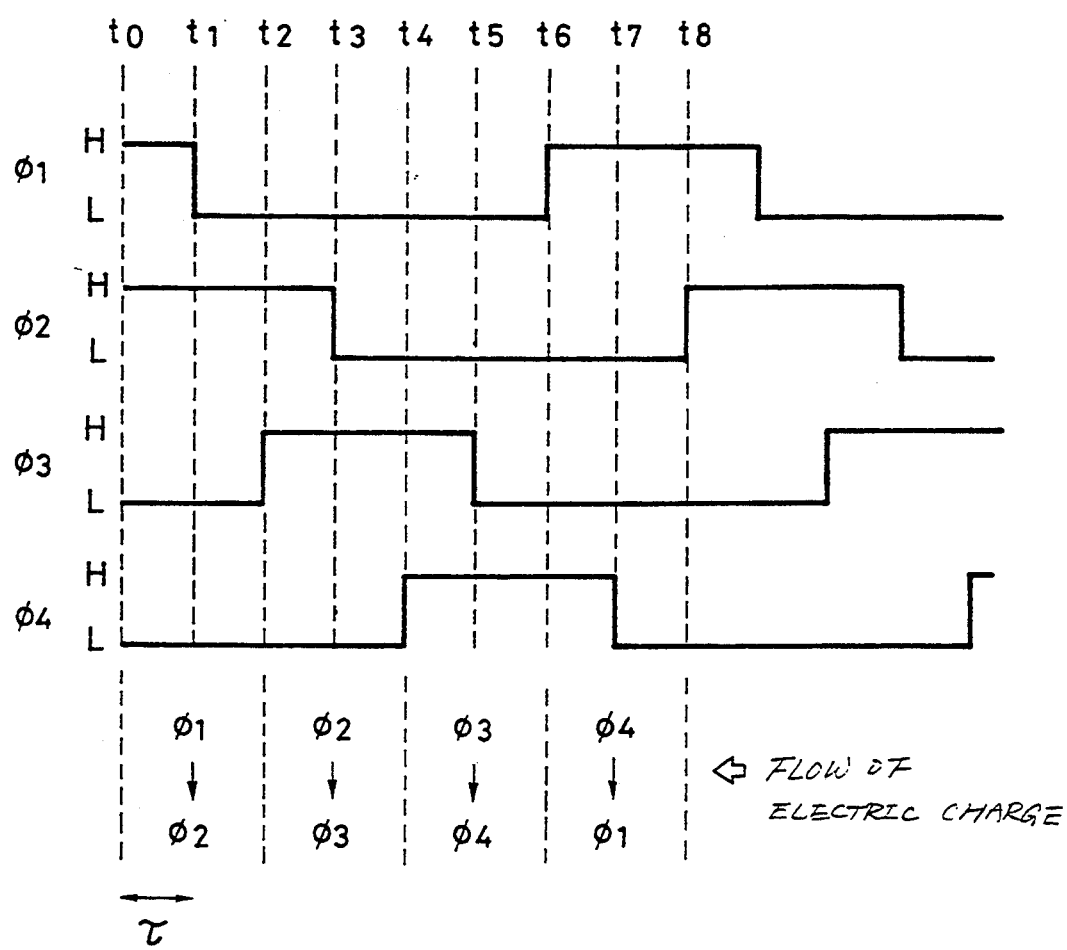
FIG. 2 is a diagram of waveforms of 4-phase drive pulses, and to which references will be made in explaining a charge transfer operation of the register of FIG. 1 in the horizontal direction.

According to this embodiment, the first and third transfer sections 21, 23 and the second, fourth transfer sections 22, 24 in the registers 11 to 13 are previously arranged so as to have the potential differences therebetween by the ion implantation technique of impurities and electric charges are transferred in the horizontal (H) direction within the registers 11 to 13 by the simplified four-phase drive clock pulses $\Phi_1$ through $\Phi_4$ shown in FIG. 5. Therefore, assuming that $\tau$ represents a charge transfer period shown in FIG. 5, then one cycle of the clock is represented as $\tau \times 4$, thus the transfer rate being reduced as compared with the prior art of FIG. 2. One cycle of clock in FIG. 2 becomes $\tau \times 8$ as compared with the structure of the same transfer section of this embodiment. Therefore, according to this embodiment, the charge transfer time within the registers 11 to 13 can be reduced and the so-called data rate can be doubled as compared with that of the prior art.

Having described the preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claims.

What is claimed is:

1. A charge transfer device having a four-phase drive system register in which first second, third and fourth transfer sections sequentially arrayed constitute one bit, each transfer section having a transfer gate electrode, characterized in that said first, second, third and fourth transfer sections are arranged such that, when applied with drive pulses of the same level, a potential difference occurs between said first and third transfer sections and those of said second and fourth transfer sections, and that charges are transferred by four-phase drive pulses such that during a first time period said first and second transfer sections are at a high level and said third and fourth transfer sections are at a low level to define a first transfer interval, during a second time period said first and second transfer sections turn to a low level and said third transfer section turns to a high level substantially simultaneously, such that said first, second and fourth transfer sections are at a low level and said third transfer section is at a high level during a second transfer interval, during a third time period said fourth transfer section turns to a high level, such that said first and second transfer sections are at a low level and said third and fourth transfer sections are at a high level during a third transfer interval, during a fourth time period said first transfer section turns to a high level and said third and fourth transfer sections turn to a low level substantially simultaneously such that said first transfer section is at a high level and said second, third and fourth transfer sections are at a low level during a fourth transfer interval, and during a fifth time period such that said second transfer section turns to high level.

2. A charge transfer device according to claim 1, wherein said first through fourth transfer sections are comprised of channel regions of a first conductivity type formed on a second conductivity type well region formed on the second conductivity type semiconductor substrate and first to fourth transfer electrodes disposed on said first conductivity type channel regions through an insulating layer.

3. A charge transfer device according to claim 2, wherein potentials of said first and third transfer sections are made different from those of said second and fourth transfer sections by implanting impurities of different concentrations into said channel region different.

4. A color linear sensor comprising:
   (a) a sensor array in which photosensing elements of R, G, B are repeatedly arrayed at the fundamental unit in a linear fashion;
   (b) a read-out gate for sequentially reading out one of said photosensing elements corresponding to said R, G and B; and
   (c) a transfer gate for transferring an output of said read-out gate to first to third shift registers, wherein said first to third shift registers are formed of first through fourth transfer sections sequentially arrayed to form one bit, each section having a transfer gate electrode, said first, second, third and fourth transfer sections are arranged such that, when applied with drive pulses of the same level, a potential difference occurs between said first and third transfer sections and those of said second and fourth transfer sections, and charges are transferred by four-phase drive pulses such that during a first time period, said first and second transfer sections are at a high level and said third and fourth transfer sections are at a low level to define a first transfer interval, during a second time period said first and second transfer sections turn to a low level and said third transfer section turns to a high level substantially simultaneously such that said first, second and fourth transfer sections are at a low level and said third transfer section is at a high level during a second transfer interval, during a third time period said fourth transfer section turns to a high level such that said first and second transfer sections are at a low level and said third and fourth transfer sections are at a high level during a third transfer interval, during a fourth time period said first transfer section turns to a high level and said third and fourth transfer sections turn to a low level substantially simultaneously such that said first transfer section is at a high level and said second, third and fourth transfer sections are at a low level during a fourth transfer interval, and during a fifth time period said second transfer section turns to high level.

5. A color linear sensor according to claim 4, wherein electric charges are transferred among said first through said third registers by said drive pulses supplied to said first through said fourth transfer sections.

* * * * *